(12) United States Patent
Park

(10) Patent No.: US 7,282,976 B2
(45) Date of Patent: Oct. 16, 2007

(54) APPARATUS AND METHOD FOR DUTY CYCLE CORRECTION

(75) Inventor: Sang-Wook Park, Seoul (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/876,209

(22) Filed: Jun. 23, 2004
(Under 37 CFR 1.47)

(65) Prior Publication Data
US 2005/0104640 A1 May 19, 2005

(30) Foreign Application Priority Data
Oct. 29, 2003 (KR) ............... 10-2003-0075921

(51) Int. Cl.
*H03K 5/02* (2006.01)
(52) U.S. Cl. .................. 327/172; 327/173
(58) Field of Classification Search ........ 327/172, 327/173, 174, 175, 176
See application file for complete search history.

(56) References Cited

U.S. PATENT DOCUMENTS 6,342,801 B1 * 1/2002 Shin .................. 327/175
6,859,081 B2 * 2/2005 Hong et al. ........ 327/175

* cited by examiner

*Primary Examiner*—Linh My Nguyen
(74) *Attorney, Agent, or Firm*—Blakely Sokoloff Taylor & Zafman

(57) ABSTRACT

The present invention related to an apparatus and a method for increasing a voltage level of duty correction voltages to a predetermined level during a predetermined time in a delay locked loop. An apparatus, included in a delay locked loop, includes a control block for generating a control signal keeping a first logic state during the predetermined time in response to a reset signal resetting the delay locked loop; and a voltage supplier for supplying the duty correction voltage with a supply voltage during the predetermined time in the control signal, wherein the duty correction voltage is for correcting a duty cycle of a clock signal used in the delay locked loop.

15 Claims, 6 Drawing Sheets

APPARATUS AND METHOD FOR DUTY CYCLE CORRECTION

FIELD OF INVENTION

The present invention relates to an apparatus and a method for correcting a duty cycle; and, more particularly, to an apparatus and a method for generating a duty correction voltage in response to a duty cycle error of a clock signal.

DESCRIPTION OF PRIOR ART

As an operation speed of a synchronous dynamic random access memory SDRAM is faster, a capability and a performance of a double data rate SDRAM (DDR SDRAM) great depend on a performance of a delay locked loop block (hereinafter, referred to a DLL). As a result, a duty cycle of a clock signal used in the DLL is also considered as a critical point.

FIG. 1 is a waveform showing clock signals prior to a duty correction. As shown, if each duty cycle of the clock signals is unstable, a timing margin of operations is reduced. Namely, if each duty cycle variation of the clock signals is larger, an interval between each control signal or each data should be smaller.

Thus, for ensuring an enough timing margin, a duty control block shown in FIG. 2 is necessary. The conventional duty control block includes a duty correction block 210 and a duty check block 220. The duty correction block 210 receives a first clock signal CLK and a second clock signal CLKB. After adjusting a duty cycle of the clock signal by adding first and second duty correction voltages Vdcc and Vdccb to the first clock signal CLK and the second clock signal CLKB, the duty correction block 210 outputs a first corrected clock signal CLKOUT and a second corrected clock signal CLKOUTB. The duty check block 220 feeds back the first and second corrected clock signals CLKOUT and CLKOUTB and checks duty cycles of the first and second corrected clock signals CLKOUT and CLKOUTB. Then, the duty check block 220 outputs the first and second duty correction voltages Vdcc and Vdccb, which correspond to each duty cycle error between the first and second corrected clock signals CLKOUT and CLKOUTB, to the duty correction block 210.

As a result, as shown in FIG. 3, the first and second corrected clock signals CLKOUT and CLKOUTB are adjusted by the conventional duty control block shown in FIG. 2. Namely, the clock signals shown in FIG. 1 are changed into first and second corrected clock signals CLKOUT and CLKOUTB shown in FIG. 3 through the conventional duty control block shown in FIG. 2.

Herein, referring to Kr. Patents No. 10-0401522 issued on Sep. 30, 2003 to Y. Choi (Kr. Application No. 2001-58153 filed on Sep. 20, 2001) and entitled "DUTY CORRECTION CIRCUIT", another conventional duty control block is described in detail. So, the general operation of the conventional duty control block is omitted.

Meanwhile, the conventional duty control block shown in FIG. 2 has a problem that the first and second duty correction voltages Vdcc and Vdccb are not rapidly increased to a predetermined voltage level. Thus, there is needed a lot of time for correcting each duty cycle error of the first and second corrected clock signals CLKOUT and CLKOUTB. Finally, it affects an operating time of the DLL.

FIG. 4A is a circuit diagram describing the duty check block 220 included in the conventional duty control block in accordance with an embodiment of the prior art.

When a reset signal RST, which is for resetting a DLL, is inputted as a logic high level, the first and second duty correction voltages Vdcc and Vdccb become a ground voltage level. Herein, the bias control signal VCN is a logic high level. The bias control signal VCN is a signal for supplying a bias voltage to the duty check block 220. In detail, if the first corrected clock signal CLKCOUT is a logic high level, three transistors 401, 403 and 404 are turned on; and, then, the first duty correction voltages Vdcc is coupled to a ground. Also, the second duty correction voltages Vdccb is coupled to the ground through four transistors 403, 401, 404 and 406. Otherwise, though the second corrected clock signal CLKCOUTB is a logic high level, the first and second duty correction voltages Vdcc and Vdccb are also coupled to the ground.

FIG. 4B is a graph depicting the first and second duty correction voltages Vdcc and Vdccb shown in FIG. 4A. As shown, the first and second duty correction voltages Vdcc and Vdccb are slowly increased from the ground to the predetermined level during a set-up time ts.

SUMMARY OF INVENTION

It is, therefore, an object of the present invention to provide an apparatus and a method for generating a duty correction voltage, which corresponds to a duty cycle error of a clock signal, in order to quickly correct a duty cycle of the clock signal at an initial state of a delay locked loop included in a semiconductor memory device.

In accordance with an aspect of the present invention, there is provided an apparatus, included in a delay locked loop, for increasing a voltage level of a duty correction voltage to a predetermined level during a predetermined time, including a control block for generating a control signal keeping a first logic state during the predetermined time in response to a reset signal resetting the delay locked loop; and a voltage supplier for supplying the duty correction voltage with a supply voltage during the predetermined time in the control signal, wherein the duty correction voltage is for correcting a duty cycle of a clock signal used in the delay locked loop.

In accordance with another aspect of the present invention, there is provided an apparatus for correcting a duty cycle of a clock signal, including a duty correction block for receiving the clock signal and adjusting the duty cycle of the clock signal in response to a duty correction voltage; a duty check block for receiving an output clock from the duty correction block and checking a duty clock error of the output clock to thereby generate the duty correction voltage; and a voltage pull-up block for increasing a voltage level of the duty correction voltage to a predetermined level during a predetermined time, wherein the voltage pull-up block includes a control block for generating a control signal keeping a first logic state during the predetermined time in response to a reset signal resetting the delay locked loop; and a voltage supplier for supplying the duty correction voltage with a power supply during the predetermined time in response to the control signal.

In accordance with another aspect of the present invention, there is provided a method for increasing a voltage level of duty correction voltages to a predetermined level during a predetermined time in a delay locked loop, including the steps of A) generating a control signal keeping a first logic state during the predetermined time in response to a reset signal resetting the delay locked loop; and B) supplying the duty correction voltages with a supply voltage during the predetermined time in response to the control signal in order to correcting a duty cycle of a clock signal used in the delay locked loop.

In accordance with another aspect of the present invention, there is provided a method for correcting a duty cycle of a clock signal, including steps of A) receiving the clock signal and adjusting the duty cycle of the clock signal in response to duty correction voltages; B) receiving an output clock from the duty correction block and checking a duty clock error of the output clock to thereby generate the duty correction voltages; and C) increasing a voltage level of the duty correction voltages to a predetermined level during a predetermined time, wherein the step C) includes C-1) generating a control signal keeping a first logic state during the predetermined time in response to a reset signal resetting the delay locked loop; and C-2) supplying the duty correction voltages with a power supply during the predetermined time in response to the control signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an apparatus and a method for generating a duty correction voltage, which corresponds to a duty cycle error of a clock signal, according to the present invention will be described in detail referring to the accompanying drawings.

Figure 5A:
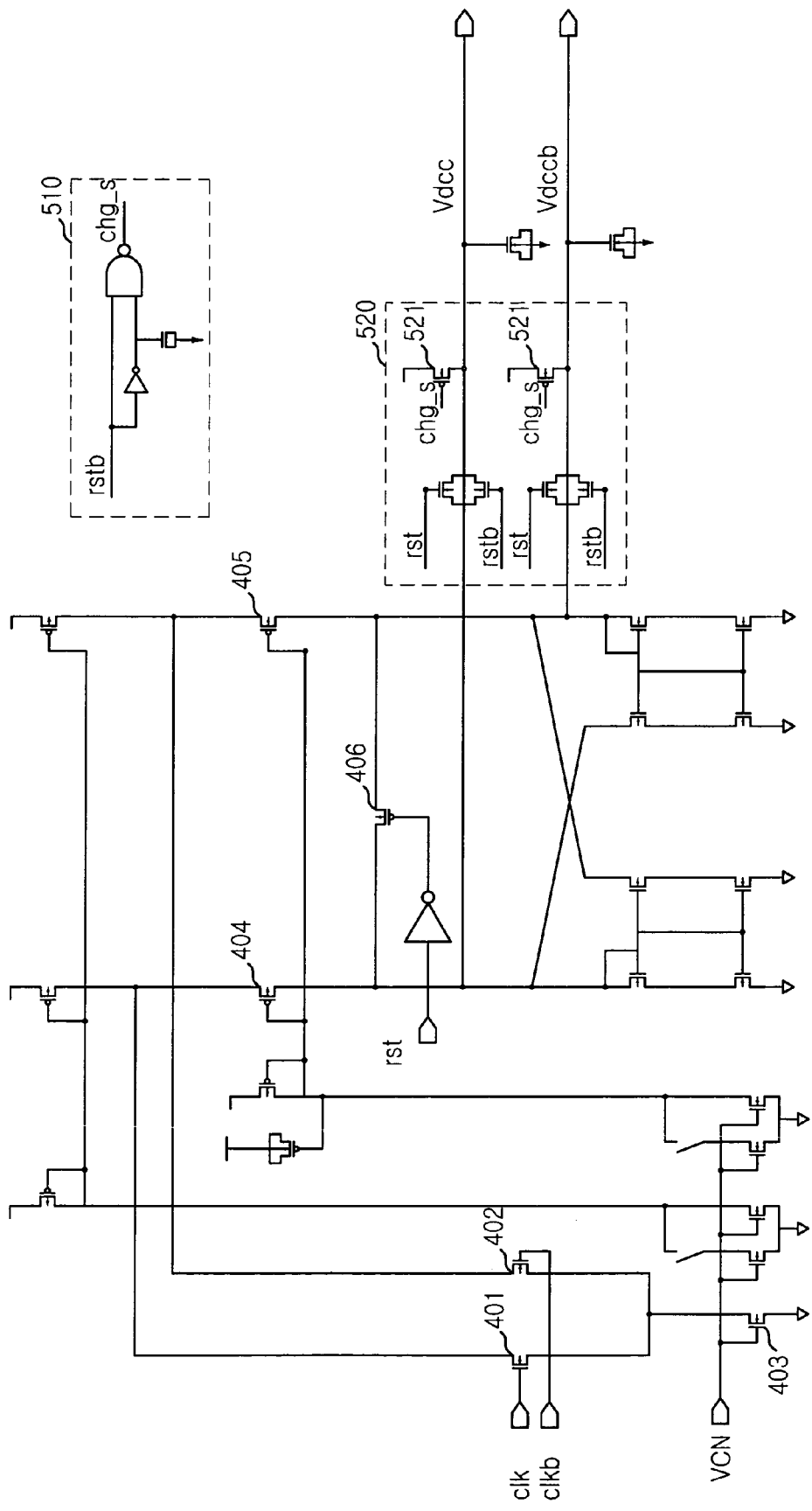
FIG. 5A is a circuit diagram describing a duty check block included in a duty control block in accordance with an embodiment of the present invention.

FIG. 5A is a circuit diagram describing a duty check block included in a duty control block in accordance with an embodiment of the present invention.

Figure 1:
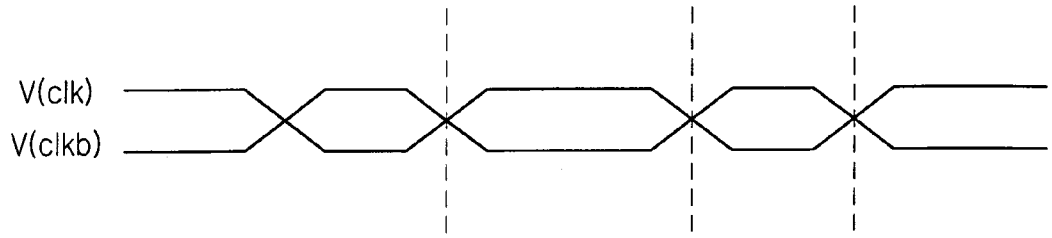
FIG. 1 is a waveform showing a clock signal prior to a duty correction.
Figure 2:
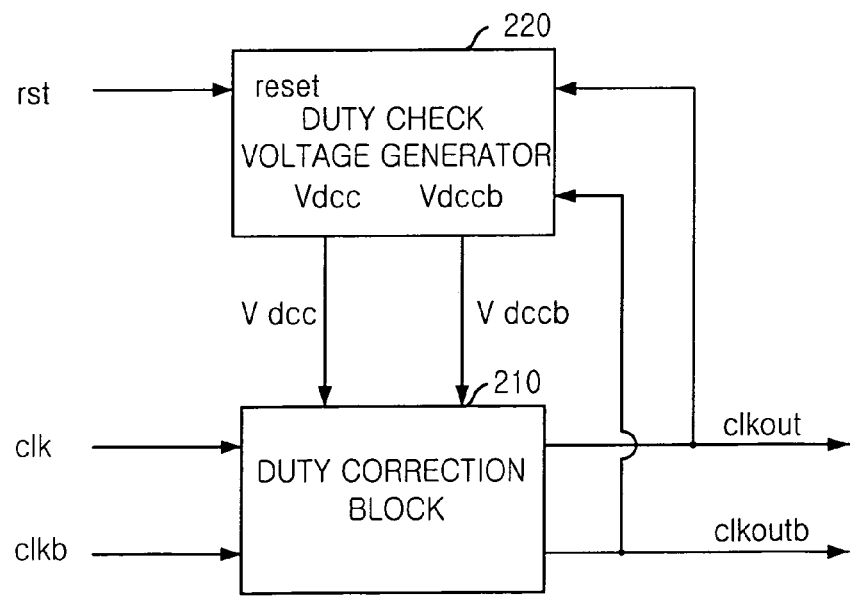
FIG. 2 is a block diagram describing a conventional duty control block.
Figure 3:
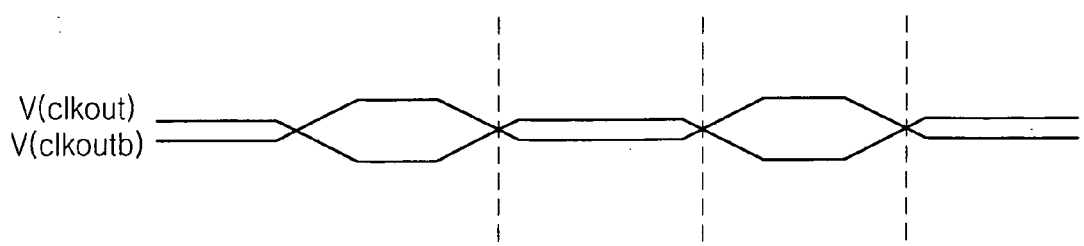
FIG. 3 is a waveform showing a clock signal after a duty correction.
Figure 4A:
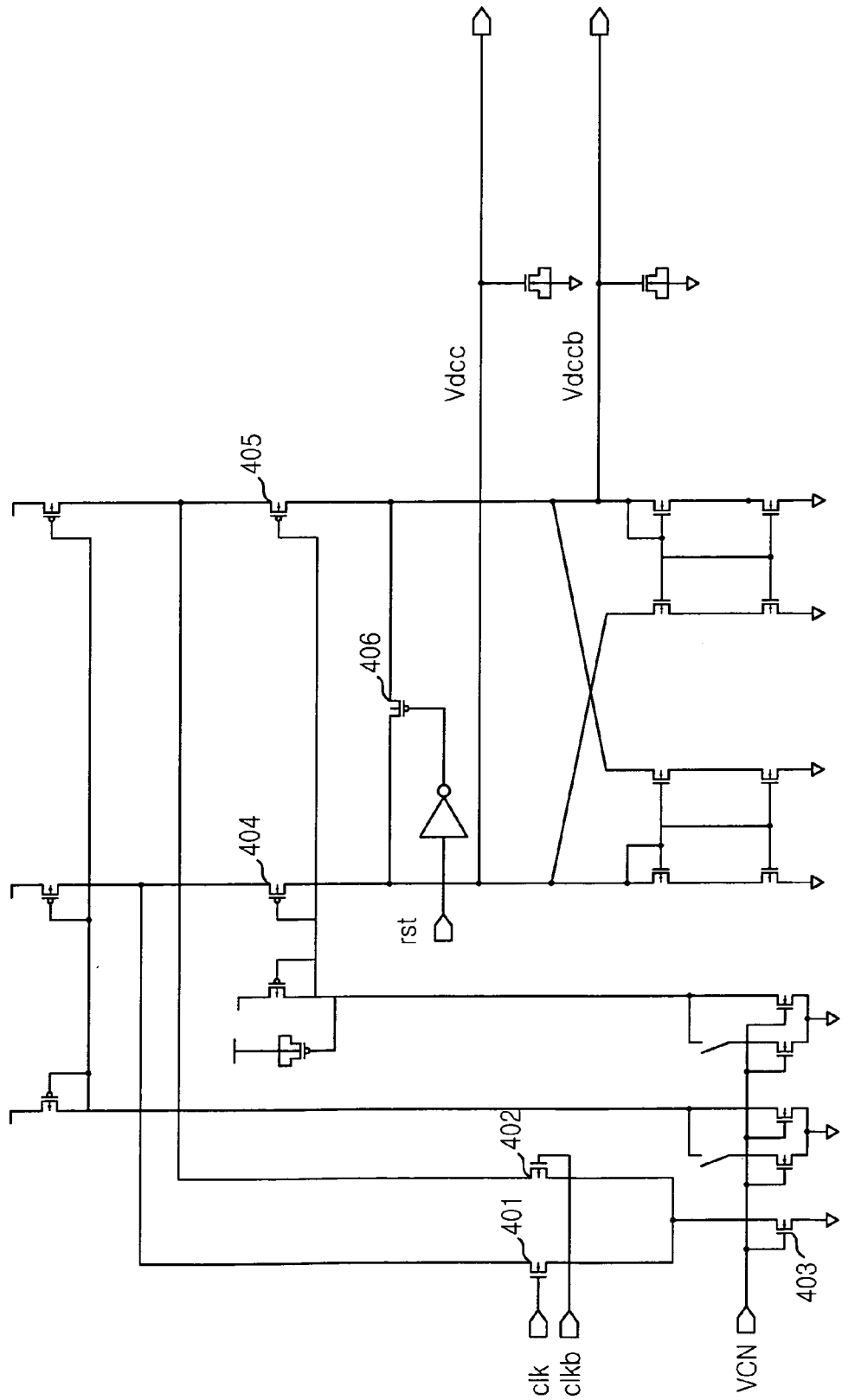
FIG. 4A is a circuit diagram describing a duty check block included in the conventional duty control block in accordance with an embodiment of the prior art.

As shown, the duty check block is similar to the duty check block shown in FIG. 4A. However, the duty check block in accordance with the present invention further includes an additional block 520 having a control block 510 and a voltage supplier 521.

The control block 510 generates a control signal chg_s keeping a first logic state during the predetermined time in response to a reset signal rst resetting the duty check block. For example, the control block 510 can include a pulse generator for making the control signal chg_s in a shape of a pulse by using the reset signal rst.

In detail, referring to FIG. 5A, the control block 510 includes a delay block and a logic block. The delay block constituted with at least one serially connected inverter delays the reverse reset signal rstb. The logic block constituted with a NAND gate receives the reverse reset signal rstb and an output signal from the delay block and logically combines the reverse reset signal rstb and the output signal from the delay block to thereby generate the control signal chg_s keeping the first logic state during the predetermined time. Herein, the first logic state is a logic low level.

Moreover, the control block can include a capacitor between the delay block and the logic block. The capacitor is constituted with at least one MOS transistor; and, if there is needed large capacitance, the capacitor should include a lot of MOS transistors.

Also, the voltage supplier 521 supplies a supply voltage to each of first and second duty correction voltages Vdcc and Vdccb during the predetermined time. Herein, the voltage supplier 521 is constituted with a MOS transistor, which is coupled to the supply voltage and each of the first and second duty correction voltages Vdcc and Vdccb, having a gate for receiving the control signal chg_s. The first and second duty correction voltages Vdcc and Vdccb are used for correcting a duty cycle of a clock signal used in the delay locked loop.

Referring to FIG. 5A, the voltage supplier 521 is constituted with a PMOS transistor having a gate, a drain and a source, the gate for receiving the control signal, the source coupled to the supply voltage and the drain coupled to the first and second duty correction voltages Vdcc and Vdccb.

As shown in FIG. 5A, if the voltage supplier 521 has a PMOS transistor, the control block 510 should outputs the control signal chg_s, which has a logic low level only during a predetermined period in response to the inverse reset signal rstb, for activating the PMOS transistor. However, otherwise, the control signal chg_s outputted from the control block 510 should has a logic high level only during the predetermined period in response to the inverse reset signal rstb in order to activate the NMOS transistor.

Figure 5B:
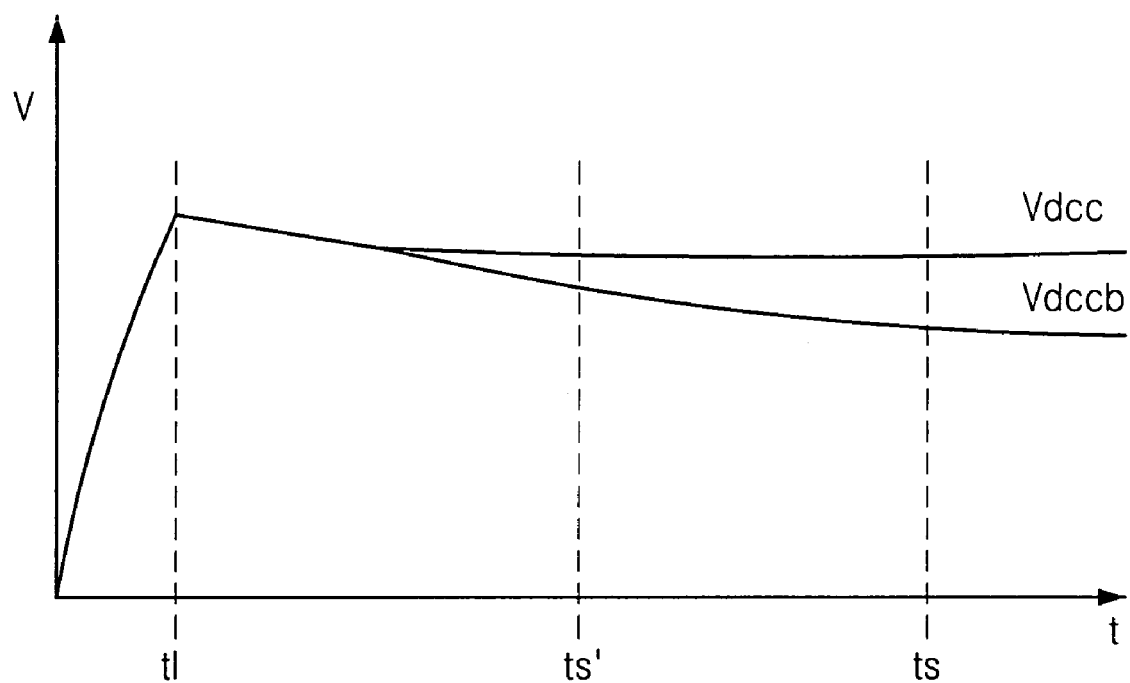
FIG. 5B is a graph depicting first and second duty correction voltages shown in FIG. 5A.

FIG. 5B is a graph depicting the first and second duty correction voltages Vdcc and Vdccb shown in FIG. 5A.

Figure 4B:
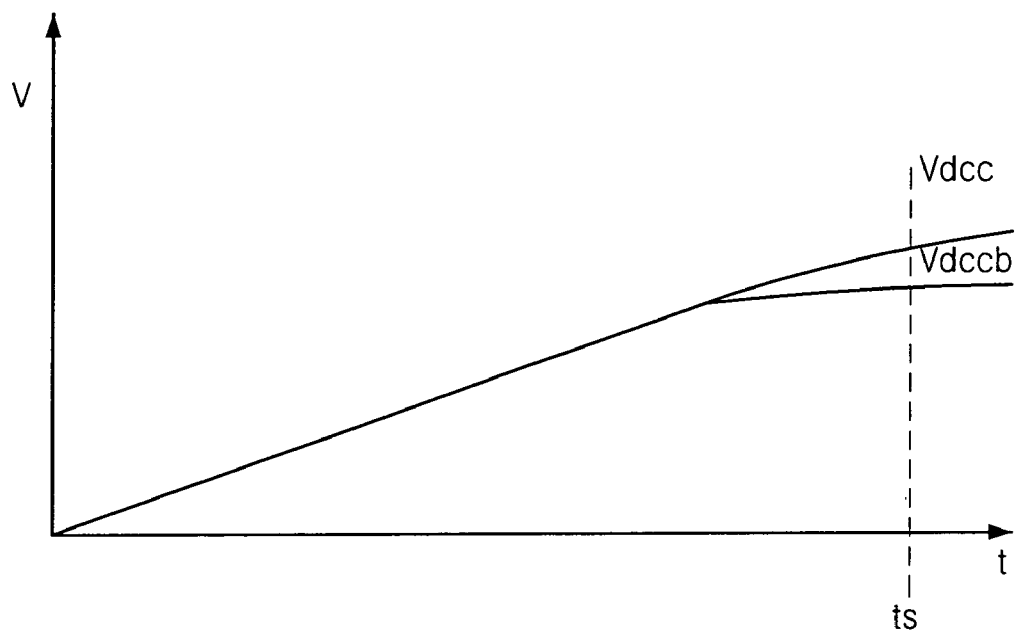
FIG. 4B is a graph depicting first and second duty correction voltages shown in FIG. 4A.

As shown, the first and second duty correction voltages Vdcc and Vdccb can be increased to a predetermined voltage level, e.g., a voltage level of supply voltage, during an initial time t1. Also, a present set-up time ts' can be much shorter than the set-up time ts of the prior art shown in FIGS. 4B and 5B.

Figure 6:
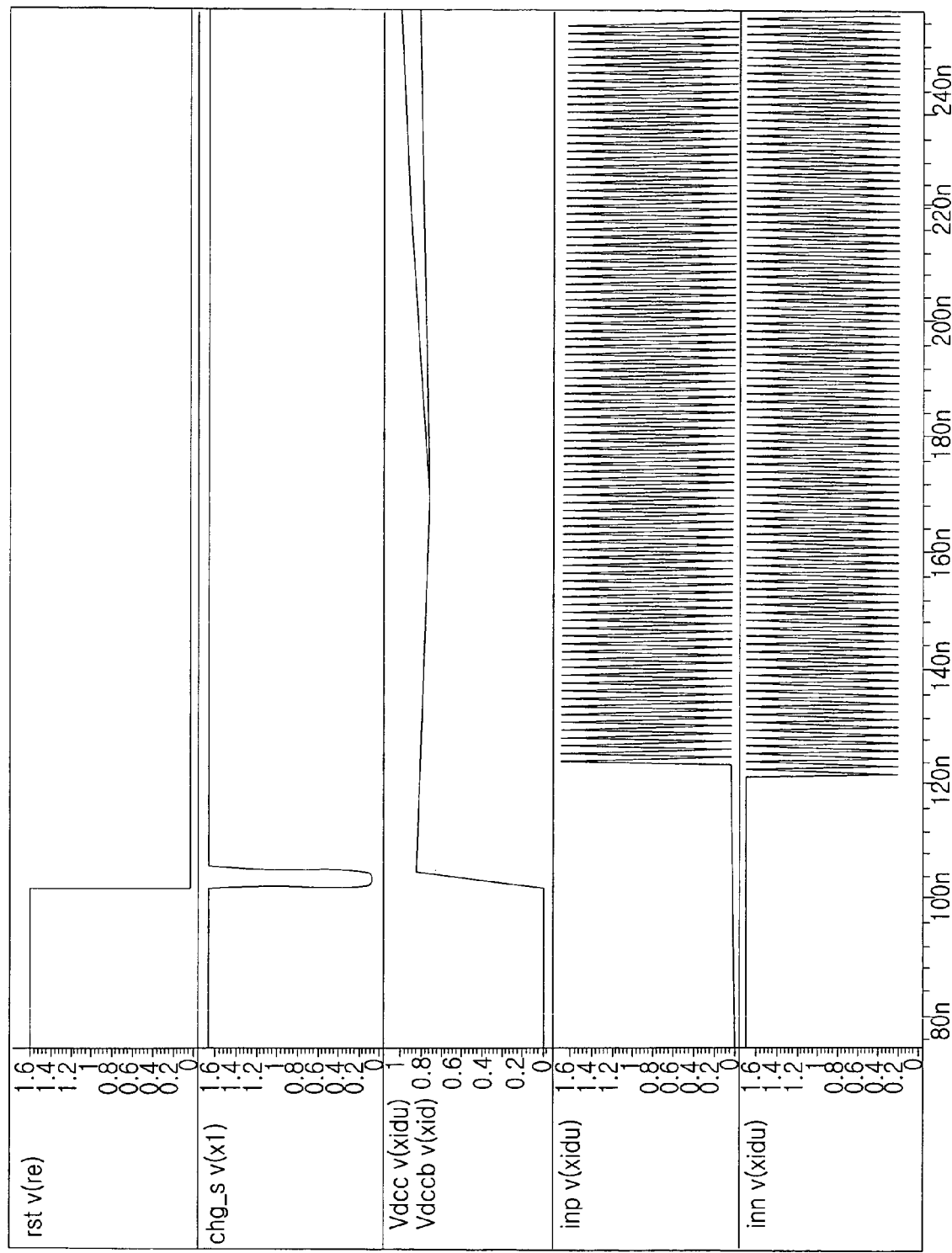
FIG. 6 is a waveform demonstrating a simulation result of the duty correction voltages in accordance with the present invention.

FIG. 6 is a waveform demonstrating a simulation result of the duty correction voltages in accordance with the present invention.

As shown, if the reset signal rst is inputted as a logic low level, the control signal chg_s becomes a logic low level during a predetermined time. Then, as being supplied with the supply voltage in response to the control signal chg_s, the first and second duty correction voltages Vdcc and Vdccb are increased to a predetermined voltage level.

The present application contains subject matter related to Korean patent application No. 2003-75921, filed in the Korean Patent Office on Oct. 29, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus, included in a delay locked loop, for correcting a duty cycle of a clock signal, comprising:
   a duty correction block for receiving the clock signal and adjusting the duty cycle of the clock signal in response to duty correction voltages to thereby output a duty corrected clock signal;
   a duty check block for receiving the duty corrected clock signal and checking a duty cycle error of the duty corrected clock signal to thereby generate the duty correction voltages;
   a control block for generating a control signal keeping a first logic state during a predetermined time in response to a reset signal resetting the delay locked loop; and
   a voltage supplier for providing a supply voltage as the duty correction voltages during the predetermined time in response to the control signal,
   wherein the control block is provided with a pulse generator for generating the control signal in a shape of a pulse by using the reset signal, the pulse generator including:
   a delay block for delaying the reset signal; and
   a logic block for receiving the reset signal and an output signal from the delay block to thereby generate the control signal keeping the first logic state during the predetermined time.

2. The apparatus as recited in claim 1, wherein the control block further includes a capacitor between the delay block and the logic block.

3. The apparatus as recited in claim 1, wherein the logic block is constituted with a NAND gate.

4. The apparatus as recited in claim 1, wherein the voltage supplier is constituted with at least one PMOS transistor, each having a gate, a drain and a source, the gate for receiving the control signal, the source coupled to the supply voltage and the drain coupled to the duty correction voltages.

5. An apparatus for correcting a duty cycle of a clock signal, comprising:
   a duty correction block for receiving the clock signal and adjusting the duty cycle of the clock signal in response to duty correction voltages to thereby output a duty corrected clock signal;
   a duty check block for receiving the duty corrected clock signal and checking a duty cycle error of the duty corrected clock signal to thereby generate the duty correction voltages; and
   a voltage pull-up block for increasing a voltage level of the duty correction voltages to a predetermined level during a predetermined time,
   wherein the voltage pull-up block includes:
   a control block for generating a control signal keeping a first logic stately logically combining a reset signal for resetting the apparatus and a delay signal of the reset signal during the predetermined time, the control block including a pulse generator for generating the control signal in a shape of a pulse by using the reset signal; and
   a voltage supplier for providing a power supply voltage as the duty correction voltage during the predetermined time in response to the control signal.

6. The apparatus as recited in claim 5, wherein the pulse generator includes:
   a delay block for delaying the reset signal; and
   a logic block for receiving the reset signal and an output signal from the delay block to thereby generate the control signal keeping the first logic state during the predetermined time.

7. The apparatus as recited in claim 6, wherein the first logic state is a logic low level.

8. The apparatus as recited in claim 6, wherein the control block further includes a capacitor between the delay block and the logic block.

9. The apparatus as recited in claim 6, wherein the logic block is constituted with a NAND gate.

10. The apparatus as recited in claim 5, wherein the voltage supplier is constituted with a PMOS transistor having a gate, a drain and a source, the gate for receiving the control signal, the source coupled to the supply voltage and the drain coupled to the duty correction voltages.

11. A method for increasing a voltage level of duty correction voltages to a predetermined level during a predetermined time in a delay locked loop, comprising the steps of:
   A) generating a control signal keeping a first logic state during the predetermined time in response to a reset signal resetting the delay locked loop, wherein the predetermined time is decided by logically combining the reset signal and a delayed reset signal; and
   B) providing a supply voltage as the duty correction voltages during the predetermined time in response to the control signal in order to correcting a duty cycle of a clock signal used in the delay locked loop.

12. The apparatus as recited in claim 11, wherein the control signal is a signal in a shape of a pulse.

13. A method for correcting a duty cycle of a clock signal, comprising steps of:
   A) receiving the clock signal and adjusting the duty cycle of the clock signal in response to duty correction voltages;
   B) receiving an output clock from the duty correction block and checking a duty clock error of the output clock to thereby generate the duty correction voltages; and
   C) increasing a voltage level of the duty correction voltages to a predetermined level during a predetermined time,
   wherein the step C) includes:
   C-1) generating a control signal keeping a first logic state during the predetermined time in response to a reset signal resetting the delay locked loop, wherein the predetermined time is decided by logically combining the reset signal and a delayed reset signal; and
   C-2) supplying a power supply as the duty correction voltages during the predetermined time in response to the control signal.

14. The method as recited in claim 13, wherein the control signal is a signal in a shape of a pulse.

15. An apparatus for correcting a duty cycle of a clock, comprising:
   a duty correction block for receiving the clock signal and adjusting the duty cycle of the clock signal in response to duty correction voltages to output a duty corrected clock signal;
   a duty check block for receiving the duty corrected clock signal and checking a duty cycle of the duty corrected clock signal to generate the duty correction voltages;
   a control block for generating a control signal activated for a predetermined time by logically combining a reset signal for resetting a delay locked loop and a delay signal of the reset signal; and
   a voltage supplier for providing a power supply voltage as the duty correction voltages for the predetermined time in response to the control signal.

* * * * *

UNITED STATES PATENT AND TRADEMARK OFFICE
CERTIFICATE OF CORRECTION

| | | |
|---|---|---|
| PATENT NO. | : 7,282,976 B2 | Page 1 of 1 |
| APPLICATION NO. | : 10/876209 | |
| DATED | : October 16, 2007 | |
| INVENTOR(S) | : Park | |

It is certified that error appears in the above-identified patent and that said Letters Patent is hereby corrected as shown below:

Col. 5, Claim 5, line 16, please delete "stately" and insert -- state by --.

Signed and Sealed this

Second Day of September, 2008

JON W. DUDAS
*Director of the United States Patent and Trademark Office*